United States Patent
Zuo et al.

(10) Patent No.: US 10,436,820 B2
(45) Date of Patent: Oct. 8, 2019

(54) SIGNAL SWITCHING DEVICE AND TEST SYSTEM

(71) Applicants: Shenzhen China Star Optoelectronics Technology Co., Ltd., Shenzhen (CN); Wuhan China Star Optoelectronics Technology Co., Ltd., Wuhan (CN)

(72) Inventors: Qingcheng Zuo, Shenzhen (CN); Chao Liang, Shenzhen (CN)

(73) Assignees: SHENZHEN CHINA STAR OPTOELECTRONICS TECHNOLOGY CO., LTD., Shenzhen (CN); WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 147 days.

(21) Appl. No.: 14/897,799

(22) PCT Filed: Sep. 17, 2015

(86) PCT No.: PCT/CN2015/089832
§ 371 (c)(1),
(2) Date: Feb. 2, 2018

(87) PCT Pub. No.: WO2017/035871
PCT Pub. Date: Mar. 9, 2017

(65) Prior Publication Data
US 2018/0156843 A1    Jun. 7, 2018

(30) Foreign Application Priority Data
Aug. 28, 2015    (CN) .......................... 2015 1 0540407

(51) Int. Cl.
*G01R 1/20* (2006.01)
*G01R 1/06* (2006.01)
*G01R 31/44* (2006.01)
*G09G 3/00* (2006.01)
*H05K 1/02* (2006.01)

(52) U.S. Cl.
CPC ............... *G01R 1/206* (2013.01); *G01R 1/06* (2013.01); *G01R 31/44* (2013.01); *G09G 3/006* (2013.01); *G09G 2330/12* (2013.01); *H05K 1/0268* (2013.01); *H05K 2201/09236* (2013.01); *H05K 2201/09245* (2013.01)

(58) Field of Classification Search
CPC ............ G01R 31/2894; G01R 31/2853; G11C 29/022; G11C 29/816
USPC .......................... 324/414, 71.11, 73.1, 76.11
See application file for complete search history.

(56) References Cited

U.S. PATENT DOCUMENTS

| | | | | |
|---|---|---|---|---|
| 9,910,053 B2 * | 3/2018 | Bakhru | ............... | G01N 33/4905 |
| 2014/0320144 A1 * | 10/2014 | Nakaya | ................. | H01M 10/54 |
| | | | | 324/434 |
| 2017/0264110 A1 * | 9/2017 | Toya | ..................... | H02J 7/0021 |

* cited by examiner

*Primary Examiner* — Giovanni Astacio-Oquendo

(57) ABSTRACT

A signal switching device and a test system are disclosed. A printed wire which is connected with a test circuit can be selected flexibly according to actual situation, and a sufficient distance between adjacent tested printed wires/test printed wires which are used for transmitting a differential signal can be maintained, such that signal interference between the printed wires would not be easily generated. Signals can be effectively separated from each other, and thus the technical problem that signal interference would easily be generated between adjacent tested printed wires/test printed wires which are used for transmitting a differential signal can be solved.

18 Claims, 6 Drawing Sheets

SIGNAL SWITCHING DEVICE AND TEST SYSTEM

CROSS REFERENCE TO RELATED APPLICATIONS

The present application claims the priority of Chinese patent application CN201510540407.8, entitled "Signal Switching Device and Test System" and filed on Aug. 28, 2015, the entirety of which is incorporated herein by reference.

FIELD OF THE INVENTION

The present disclosure relates to the technical field of signal test, and particularly to a signal switching device and a test system comprising the signal switching device.

BACKGROUND OF THE INVENTION

At present, during test procedure of a Liquid Crystal Module (LCM), a signal switching device is generally used for connection between a test apparatus and the LCM (i.e., a tested apparatus) since a port of the LCM is different from a port of the test apparatus.

FIG. 1 schematically shows a structure of a traditional signal switching device. As shown in FIG. 1, a test apparatus 30 is provided with high-speed signal test ports, low-speed signal test ports, and power source test ports. Each test port is electrically connected with a corresponding tested port of a tested apparatus 10 through a signal switching device 20. In general, each test port is electrically connected with a corresponding tested port through an electrical connector that is arranged on the signal switching device 20.

The electrical connection mode between the test apparatus 30 and the tested apparatus 10 through the signal switching device 20 in the prior art will be illustrated in detail hereinafter with reference to Table 1, Table 2, FIG. 2, and FIG. 3.

TABLE 1

| Test apparatus | Tested apparatus |
|---|---|
| 1 | D0P |
| 2 | D0N |
| 3 | CLKP |
| 4 | CLKN |
| 5 | D1P |
| 6 | D1N |
| 7 | LEDK |
| 8 | VCC |
| 9 | IOVCC |
| 10 | RESET |
| 11 | LEDA |

TABLE 2

| Test apparatus | Tested apparatus |
|---|---|
| 1 | VCC |
| 2 | LEDK |
| 3 | D1P |
| 4 | D1N |
| 5 | CLKP |
| 6 | CLKN |
| 7 | D0N |
| 8 | D0P |
| 9 | RESET |
| 10 | LEDA |
| 11 | IOVCC |

As shown by the definition of the ports in Table 1 and Table 2, the tested apparatus 10 is provided with 11 tested ports, among which there are 6 high-speed signal tested ports, i.e., D0P, D0N, D1P, D1N, CLKP, and CLKN. D0P and D0N form a pair of differential signal tested ports, D1P and D1N form a pair of differential signal tested ports, and CLKP and CLKN form a pair of differential signal tested ports. There are 3 low-speed signal tested ports, which are LEDA, LEDK, and RESET respectively. There are 2 power source tested ports, which are VCC and IOVCC respectively. As shown in Table 1, D0P is electrically connected with a test port 1 of the test apparatus 30 through the signal switching device 20. D0N is electrically connected with a test port 2 of the test apparatus 30 through the signal switching device 20. Similarly, LEDA is electrically connected with a test port 11 of the test apparatus 30 through the signal switching device 20. As shown in Table 2, VCC is electrically connected with a test port 1 of the test apparatus 30 through the signal switching device 20. LEDK is electrically connected with a test port 2 of the test apparatus 30 through the signal switching device 20. Similarly, IOVCC is electrically connected with a test port 11 of the test apparatus 30 through the signal switching device 20.

FIG. 2 and FIG. 3 schematically show arrangement modes of electrical connectors of the signal switching device 20 when the definition of the ports are shown in Table 1 and Table 2 respectively. As shown in FIG. 2 and FIG. 3, the signal switching device 20 is a matrix-type switching device. The printed wires (tested printed wires) which are connected with each of the tested ports serve as rows of the matrix, and the printed wires (test printed wires) which are connected with each of the test ports serve as columns of the matrix. An intersection point (solid dot as shown in FIG. 2 and FIG. 3) of a row and a column represents an electrical connector for connection between a tested printed wire and a corresponding test printed wire. The arrangement position of the electrical connector is determined by a port definition table that is preset by a manufacturer.

The technical defect of the traditional signal switching device 20 lies in that: when there is no ground wire between adjacent tested printed wires/test printed wires which are used for transmitting a differential signal, signal interference would be generated between the printed wires due to a near distance therebetween. With the increasing of transmission speed and the decreasing of signal amplitude of the LCM, the traditional signal switching device 20 has become a bottleneck in high-speed signal test.

SUMMARY OF THE INVENTION

When there is no ground wire between adjacent tested printed wires/test printed wires which are used for transmitting a differential signal, signal interference would be generated between the printed wires due to a near distance therebetween. In order to solve the aforesaid technical problem, the present disclosure provides a signal switching device with a high anti-interference ability and a test system comprising the signal switching device.

According to one aspect, the present disclosure provides a signal switching device, which comprises:

a plurality of first assembling units, each first assembling unit comprising two first test assembling ports in connection with a first test port and two second test assembling ports in connection with a second test port, the first test port and the second test port constituting a pair of differential signal test ports of a test apparatus;

a plurality of second assembling units, each second assembling unit comprising two first tested assembling ports in connection with a first tested port and two second tested assembling ports in connection with a second tested port, the first tested port and the second tested port constituting a pair of differential signal tested ports of a tested apparatus;

strobe switches corresponding to the assembling ports respectively; and a circuit board, which comprises test printed wires corresponding to the test assembling ports respectively, tested printed wires corresponding to the tested assembling ports respectively, and electrical connectors for electrically connecting the test printed wires and the tested printed wires, wherein each test assembling port is electrically connected with a corresponding test printed wire through a corresponding strobe switch, and each tested assembling port is electrically connected with a corresponding tested printed wire through a corresponding strobe switch;

wherein all test printed wires that are arranged parallel to one another and all tested printed wires that are arranged parallel to one another form a grid structure; and wherein a distance between the test printed wires corresponding to a same test assembling port and a distance between the tested printed wires corresponding to a same tested assembling port meet respective preset requirements.

Preferably, the signal switching device further comprises:

a third assembling unit, which comprises two third test assembling ports both in connection with a power source test port of the test apparatus; and a fourth assembling unit, which comprises two third tested assembling ports both in connection with a power source tested port of the tested apparatus.

Preferably, the signal switching device further comprises:

a fifth assembling unit, which comprises two fourth test assembling ports both in connection with a low-speed signal test port of the test apparatus; and a sixth assembling unit, which comprises two fourth tested assembling ports both in connection with a low-speed signal tested port of the tested apparatus.

Preferably, the test printed wires extend along a horizontal/vertical direction, and the tested printed wires extend along a vertical/horizontal direction.

Preferably, the tested apparatus is a liquid crystal display module.

According to another aspect, the present disclosure provides a test system, which comprises a test apparatus and a signal switching device, and the signal switching device comprises:

a plurality of first assembling units, each first assembling unit comprising two first test assembling ports in connection with a first test port and two second test assembling ports in connection with a second test port, the first test port and the second test port constituting a pair of differential signal test ports of the test apparatus;

a plurality of second assembling units, each second assembling unit comprising two first tested assembling ports in connection with a first tested port and two second tested assembling ports in connection with a second tested port, the first tested port and the second tested port constituting a pair of differential signal tested ports of a tested apparatus;

strobe switches corresponding to the assembling ports respectively; and a circuit board, which comprises test printed wires corresponding to the test assembling ports respectively, tested printed wires corresponding to the tested assembling ports respectively, and electrical connectors for electrically connecting the test printed wires and the tested printed wires, wherein each test assembling port is electrically connected with a corresponding test printed wire through a corresponding strobe switch, and each tested assembling port is electrically connected with a corresponding tested printed wire through a corresponding strobe switch;

wherein all test printed wires that are arranged parallel to one another and all tested printed wires that are arranged parallel to one another form a grid structure; and wherein a distance between the test printed wires corresponding to a same test assembling port and a distance between the tested printed wires corresponding to a same tested assembling port meet respective preset requirements.

Preferably, the signal switching device further comprises:

a third assembling unit, which comprises two third test assembling ports both in connection with a power source test port of the test apparatus; and a fourth assembling unit, which comprises two third tested assembling ports both in connection with a power source tested port of the tested apparatus.

Preferably, the signal switching device further comprises:

a fifth assembling unit, which comprises two fourth test assembling ports both in connection with a low-speed signal test port of the test apparatus; and a sixth assembling unit, which comprises two fourth tested assembling ports both in connection with a low-speed signal tested port of the tested apparatus.

Preferably, the test printed wires extend along a horizontal/vertical direction, and the tested printed wires extend along a vertical/horizontal direction.

Preferably, the tested apparatus is a liquid crystal display module.

Compared with the prior art, one embodiment or a plurality of embodiments according to the present disclosure may have the following advantages or beneficial effects.

In the signal switching device according to the present disclosure, the printed wire which is connected with a test circuit can be selected flexibly according to actual situation, and a sufficient distance between adjacent tested printed wires/test printed wires which are used for transmitting a differential signal can be maintained, such that signal interference between the tested printed wires/test printed wires would not be easily generated. According to the present disclosure, signals can be effectively separated from each other, and thus the technical problem that signal interference would easily be generated between adjacent tested printed wires/test printed wires which are used for transmitting a differential signal can be solved.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

When there is no ground wire between adjacent tested printed wires/test printed wires which are used for transmitting a differential signal, signal interference would be generated between the printed wires due to a near distance therebetween. In order to solve the aforesaid technical problem, the embodiment of the present disclosure provides a signal switching device with a high anti-interference ability.

Figure 1:
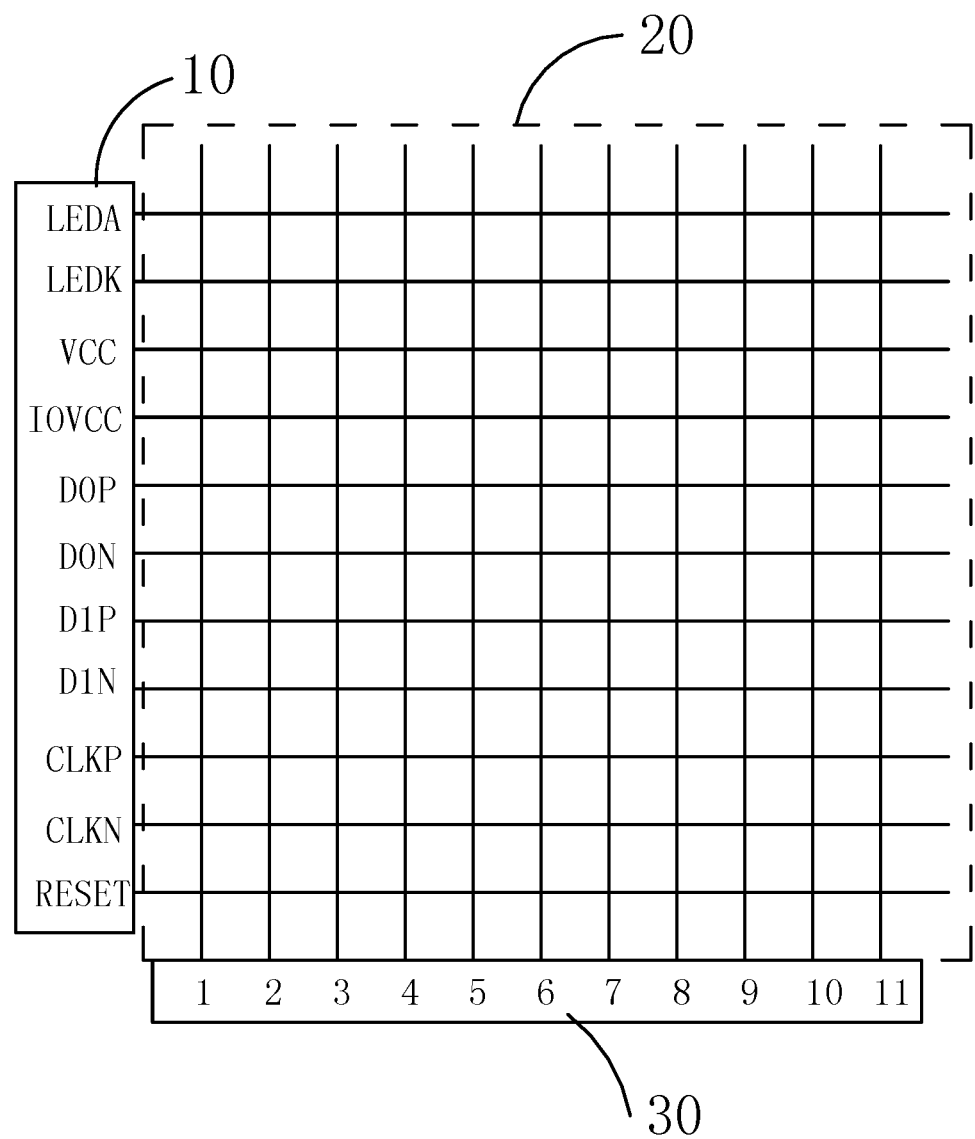
FIG. 1 schematically shows a structure of a traditional signal switching device.
Figure 2:
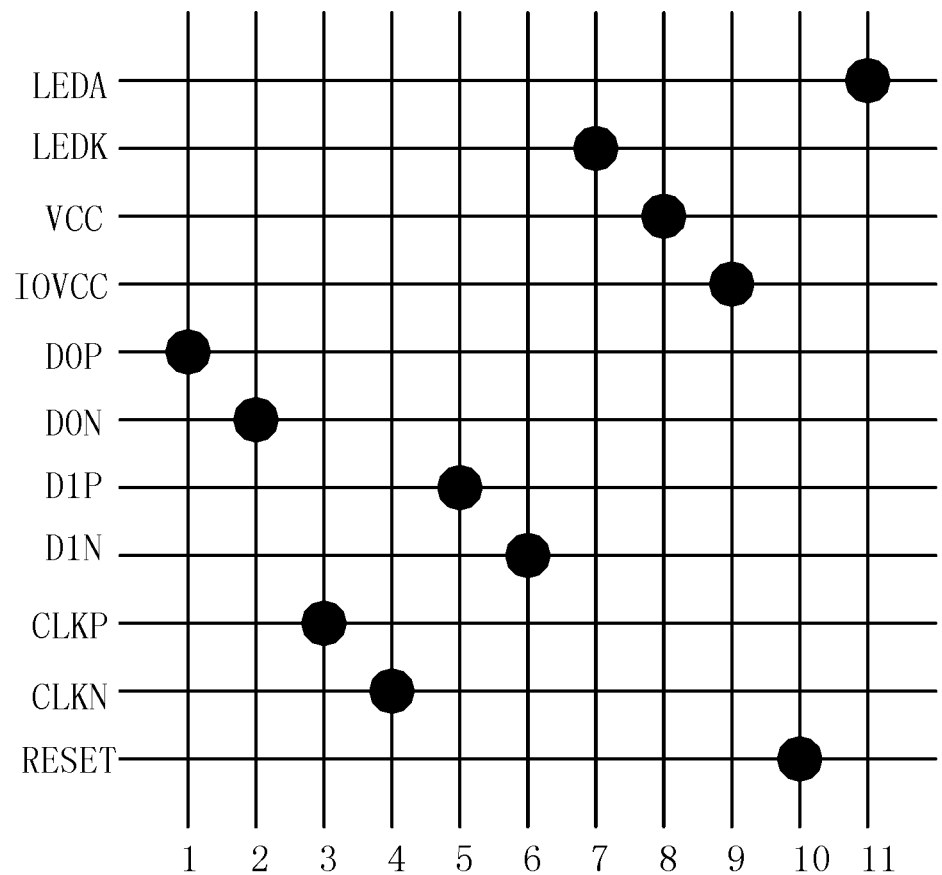
FIG. 2 schematically shows an arrangement mode of electrical connectors of a traditional signal switching device when the definition of the ports is shown in Table 1.
Figure 3:
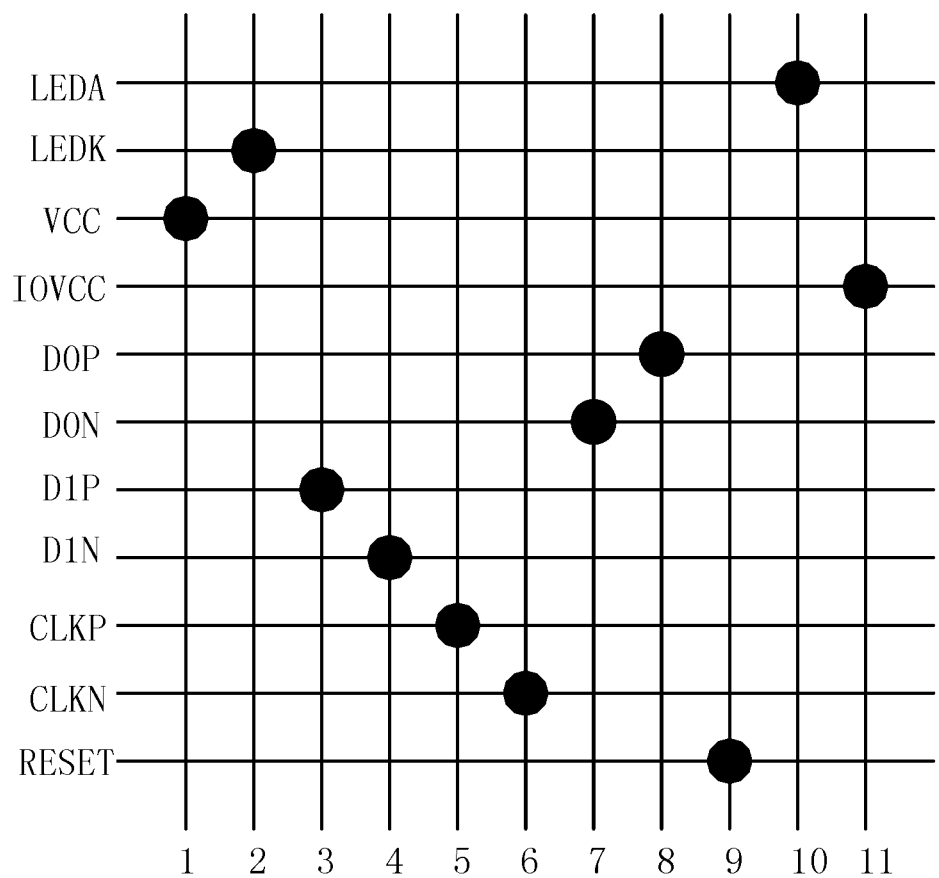
FIG. 3 schematically shows an arrangement mode of electrical connectors of a traditional signal switching device when the definition of the ports is shown in Table 2.
Figure 4:
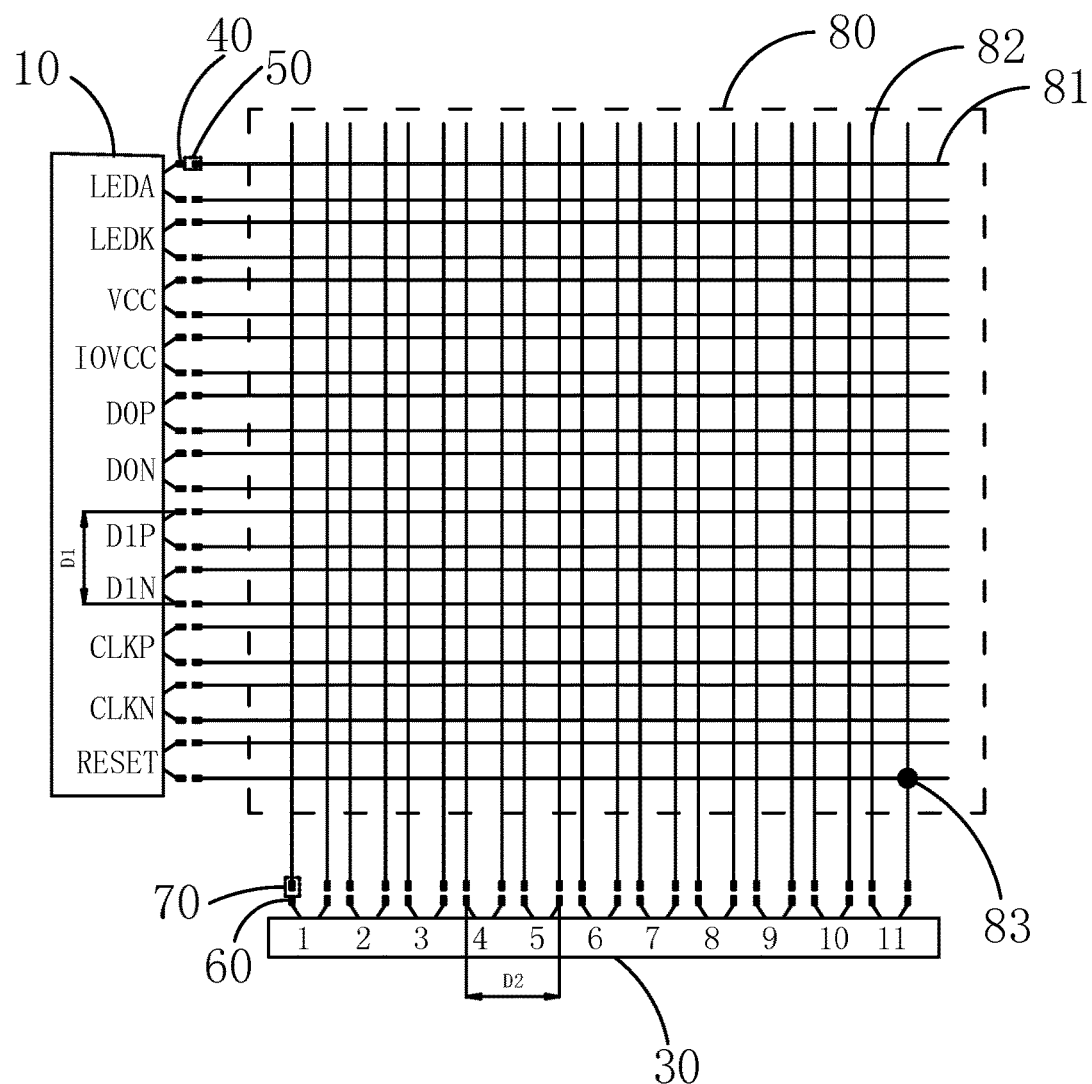
FIG. 4 schematically shows a structure of a signal switching device according to one embodiment of the present disclosure.

FIG. 4 schematically shows a structure of a signal switching device according to the embodiment of the present disclosure. According to the present embodiment, the signal switching device mainly comprises a plurality of first assembling units, a plurality of second assembling units, a plurality of strobe switches 50, 70, and a circuit board 80 which comprises printed wires 81, 82 and electrical connectors 83.

Specifically, each first assembling unit is used for assembling differential signal test ports of a test apparatus 30. A structure of each first assembling unit will be illustrated below taking one first assembling unit as an example. The first assembling unit as shown in FIG. 4 is used for assembling a pair of differential signal test ports of the test apparatus 30. The pair of differential signal test ports comprise a first test port and a second test port. The first assembling unit comprises two first test assembling ports and two second test assembling ports, wherein the two first test assembling ports are both connected with the first test port, and the two second test assembling ports are both connected with the second test port.

Correspondingly, each second assembling unit is used for assembling differential signal tested ports of a tested apparatus 10. A structure of each second assembling unit will be illustrated below taking one second assembling unit as an example. The second assembling unit as shown in FIG. 4 is used for assembling a pair of differential signal tested ports of the tested apparatus 10. The pair of differential signal tested ports comprise a first tested port and a second tested port. The second assembling unit comprises two first tested assembling ports and two second tested assembling ports, wherein the two first tested assembling ports are both connected with the first tested port, and the two second tested assembling ports are both connected with the second tested port.

Each assembling port of the signal switching device is configured with a strobe switch 50 or 70. That is, each test assembling port 60 of the signal switching device is configured with a strobe switch 70, and each tested assembling port 40 of the signal switching device is configured with a strobe switch 50.

The circuit board 80 is preferably a flexible printed circuit board. The circuit board 80 comprises test printed wires 82 corresponding to each test assembling port 60 respectively, tested printed wires 81 corresponding to each tested assembling port 40 respectively, and electrical connectors 83 for electrically connecting the test printed wires 82 and the tested printed wires 81. That is, with respect to each test assembling port 60, the circuit board 80 is provided with a test printed wire 82 corresponding to the test assembling port 60. With respect to each tested assembling port 40, the circuit board 80 is provided with a tested printed wire 81 corresponding to the tested assembling port 40. As shown in FIG. 4, all test printed wires 82 of the signal switching device are arranged parallel to one another and extend along a vertical direction, and all tested printed wires 81 of the signal switching device are arranged parallel to one another and extend along a horizontal direction. The test printed wires 82 and the tested printed wires 81 are arranged in a staggered manner to form a grid structure, wherein the test printed wires 82 constitute columns of the grid structure, and the tested printed wires 81 constitute rows of the grid structure.

Each test assembling port 60 is electrically connected with a corresponding test printed wire 82 through a corresponding strobe switch 70. Similarly, each tested assembling port 40 is electrically connected with a corresponding tested printed wire 81 through a corresponding strobe switch 50. During actual operational procedure, the signal loading state of two test printed wires 82 which correspond to one test port can be determined through controlling an on/off state of the strobe switch 70. One of the two test printed wires 82 can be loaded with signal, or the two test printed wires 82 can both be loaded with signal, which depends on the relationship between the signals. Similarly, the signal loading state of two tested printed wires 81 which correspond to one tested port can be determined through controlling an on/off state of the strobe switch 50. One of the two tested printed wires 81 can be loaded with signal, or the two tested printed wires 81 can both be loaded with signal. That is, during actual operational procedure, the on/off state of the strobe switch can be determined according to the relationship between the signals, so that signal interference can be avoided.

When the on/off state of the strobe switch is determined, an arrangement position of the electrical connector 83 can be determined. The electrical connector 83 is used for connecting the test printed wire 82 and a corresponding tested printed wire 81 so as to form a closed test circuit. Specifically, the electrical connector 83 is preferably a via hole or a tin dot.

Moreover, in order to reduce signal interference between adjacent tested printed wires 81/test printed wires 82 which are used for transmitting a differential signal, a distance between the test printed wires 82 corresponding to one test assembling port 60 and a distance between the tested printed wires 81 corresponding to one tested assembling port 40 meet a preset requirement. According to one preferred embodiment of the present disclosure, the distance D2 between the test printed wires 82 which are used for transmitting a differential signal is at least larger than twice a width of the wire, and the distance D1 between the tested printed wires 81 which are used for transmitting a differential signal is at least larger than twice a width of the wire.

According to one preferred embodiment of the present disclosure, the signal switching device further comprises one or a plurality of third assembling unit(s) and one or a plurality of fourth assembling unit(s). Each third assembling unit comprises two third test assembling ports in connection with a power source test port of the test apparatus 30, and each fourth assembling unit comprises two third tested assembling ports in connection with a power source tested port of the tested apparatus 10. Accordingly, the signal switching device further comprises strobe switches and printed wires corresponding to the newly added assembling ports (i.e., the two third test assembling ports and the two third tested assembling ports) according to the present embodiment. The connection mode among the assembling port, the strobe switch, and the printed wire according to the present embodiment is the same as that in the above embodiment, and the details of which are no longer repeated here.

According to one preferred embodiment of the present disclosure, the signal switching device further comprises one or a plurality of fifth assembling unit(s) and one or a plurality of sixth assembling unit(s). Each fifth assembling unit comprises two fourth test assembling ports in connection with a low-speed signal test port of the test apparatus 30, and each sixth assembling unit comprises two fourth tested assembling ports in connection with a low-speed signal tested port of the tested apparatus 10. Accordingly, the signal switching device further comprises strobe switches and printed wires corresponding to the newly added assembling ports (i.e., the two fourth test assembling ports and the two fourth tested assembling ports) according to the present embodiment. The connection mode among the assembling port, the strobe switch, and the printed wire according to the present embodiment is the same as that in the above embodiment, and the details of which are no longer repeated here.

The electrical connection mode between the test apparatus 30 and the tested apparatus 10 through the signal switching device according to the present embodiment will be illustrated in detail hereinafter with reference to Table 3, Table 4, FIG. 5, and FIG. 6.

TABLE 3

| Test apparatus | Tested apparatus |
|---|---|
| 1 | RESET |
| 2 | D0N |
| 3 | D0P |
| 4 | D1N |
| 5 | D1P |
| 6 | CLKN |
| 7 | CLKP |
| 8 | VCC |

TABLE 3-continued

| Test apparatus | Tested apparatus |
|---|---|
| 9 | LEDK |
| 10 | LEDA |
| 11 | IOVCC |

TABLE 4

| Test apparatus | Tested apparatus |
|---|---|
| 1 | LEDK |
| 2 | CLKN |
| 3 | CLKP |
| 4 | D1N |
| 5 | D1P |
| 6 | D0N |
| 7 | D0P |
| 8 | VCC |
| 9 | RESET |
| 10 | LEDA |
| 11 | IOVCC |

As shown by the definition of the ports in Table 3 and Table 4, the tested apparatus 10 is provided with 11 tested ports, among which there are 6 high-speed signal tested ports, i.e., D0P, D0N, D1P, D1N, CLKP, and CLKN. D0P and D0N form a pair of differential signal tested ports, D1P and D1N form a pair of differential signal tested ports, and CLKP and CLKN form a pair of differential signal tested ports. There are 3 low-speed signal tested ports, which are LEDA, LEDK, and RESET respectively. There are 2 power source tested ports, which are VCC and IOVCC respectively. As shown in Table 3, RESET is electrically connected with a test port 1 of the test apparatus 30 through the signal switching device. D0N is electrically connected with a test port 2 of the test apparatus 30 through the signal switching device. Similarly, IOVCC is electrically connected with a test port 11 of the test apparatus 30 through the signal switching device. As shown in Table 4, LEDK is electrically connected with a test port 1 of the test apparatus 30 through the signal switching device. CLKN is electrically connected with a test port 2 of the test apparatus 30 through the signal switching device. Similarly, IOVCC is electrically connected with a test port 11 of the test apparatus 30 through the signal switching device.

Figure 5:
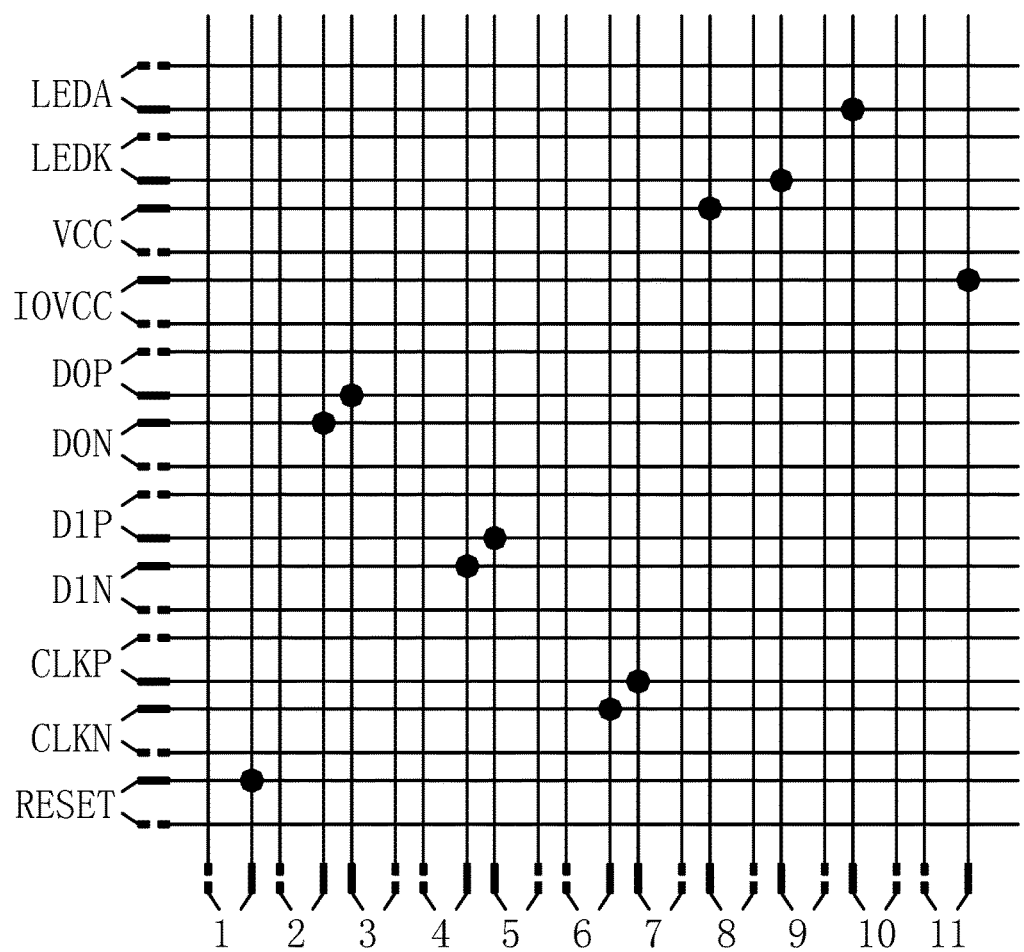
FIG. 5 schematically shows an arrangement mode of electrical connectors of the signal switching device according to one embodiment of the present disclosure when the definition of the ports is shown in Table 3.
Figure 6:
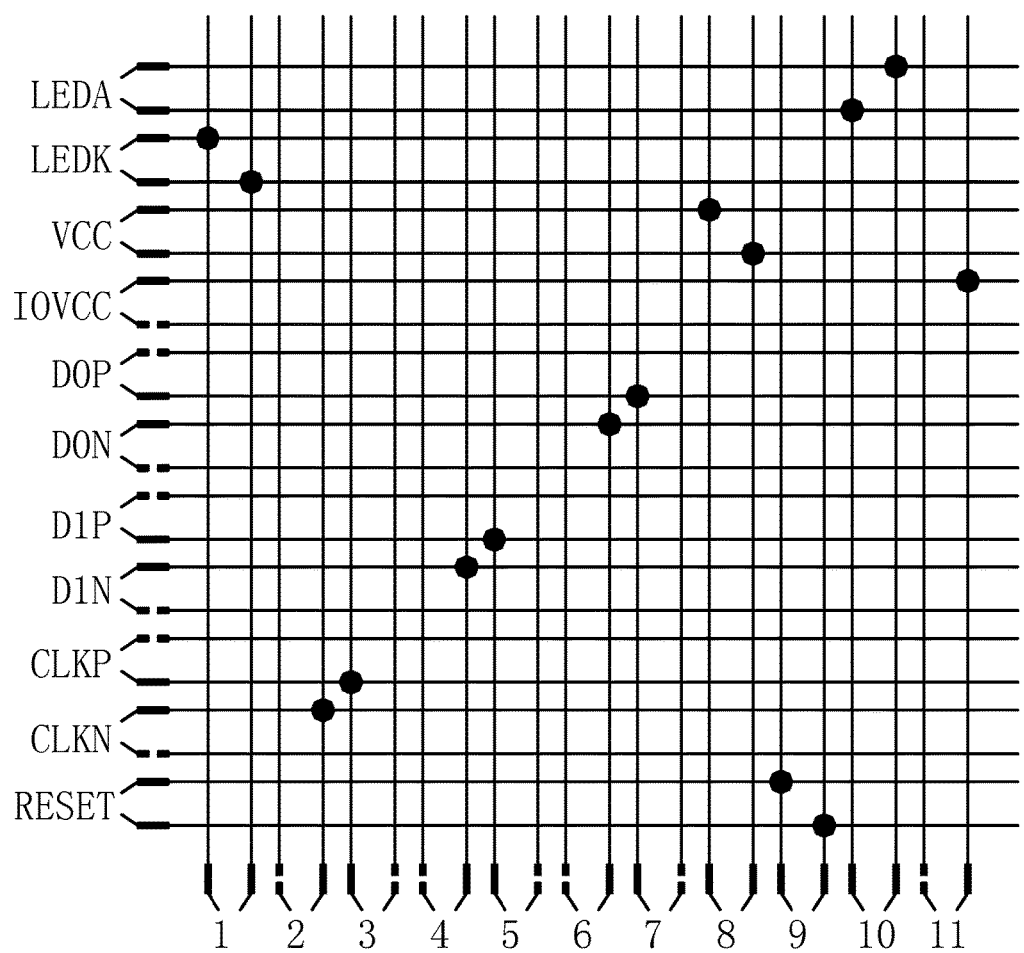
FIG. 6 schematically shows an arrangement mode of electrical connectors of the signal switching device according to one embodiment of the present disclosure when the definition of the ports is shown in Table 4.

FIG. 5 and FIG. 6 schematically show arrangement modes of electrical connectors 83 of the signal switching device when the definition of the ports are shown in Table 3 and Table 4 respectively. With respect to each test/tested port, there are two test/tested assembling ports that are electrically connected with the test/tested port respectively. One of two test/tested printed wires can be loaded with signal, or two test/tested printed wires can both be loaded with signal, which can be determined through controlling the on/off state of a corresponding strobe switch.

As shown in FIG. 5, the printed wires corresponding to all test ports and the printed wires corresponding to all tested ports are loaded with signal in an alternative manner. According to the definition of the ports as shown in Table 3, the electrical connectors 83 are arranged in a manner as shown in FIG. 5, and thus the signal interference between adjacent test printed wires 82/tested printed wires 81 which are used for transmitting a differential signal can be reduced to the largest extent.

As shown in FIG. 6, only the printed wires corresponding to IOVCC, all differential signal tested ports, and all differential signal test ports are loaded with signal in an alternative manner. According to the definition of the ports as shown in Table 4, the electrical connectors 83 are arranged in a manner as shown in FIG. 6, and thus the signal interference between adjacent test printed wires 82/tested printed wires 81 which are used for transmitting a differential signal can be reduced to the largest extent.

According to one preferred embodiment of the present disclosure, the tested apparatus 10 is a liquid crystal module. The liquid crystal module can be tested by the test apparatus 30 through the signal switching device according to the embodiment of the present disclosure.

Accordingly, the embodiment of the present disclosure further provides a test system, which comprises the test apparatus 30 and the signal switching device according to the above embodiment. Since the structure of the signal switching device is illustrated in detail hereinabove, the details of the test system are no longer repeated here.

In the signal switching device according to the present embodiment, the printed wire which is connected with a test circuit can be selected flexibly according to actual situation, so that a sufficient distance between adjacent tested printed wires 81/test printed wires 82 which are used for transmitting a differential signal can be maintained, and signal interference between the tested printed wires 81/test printed wires 82 would not be easily generated. According to the present embodiment, the signals can be separated from each other, and thus the technical problem that signal interference would easily be generated between adjacent tested printed wires 81/test printed wires 82 which are used for transmitting a differential signal can be solved. Moreover, according to the present embodiment, based on the preset definition of the ports, not only the pair of wires for a differential signal transmission can be realized, but also a serpentine wire can be realized, which can be selected flexibly during practical operation.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A signal switching device, comprising:
    a plurality of first assembling units, each first assembling unit comprising two first test assembling ports in connection with a first test port and two second test assembling ports in connection with a second test port, the first test port and the second test port constituting a pair of differential signal test ports of a test apparatus;
    a plurality of second assembling units, each second assembling unit comprising two first tested assembling ports in connection with a first tested port and two second tested assembling ports in connection with a second tested port, the first tested port and the second tested port constituting a pair of differential signal tested ports of a tested apparatus;
    strobe switches corresponding to the assembling ports respectively; and
    a circuit board, which comprises test printed wires corresponding to the test assembling ports respectively, tested printed wires corresponding to the tested assembling ports respectively, and electrical connectors for electrically connecting the test printed wires and the tested printed wires,
    wherein each test assembling port is electrically connected with a corresponding test printed wire through a corresponding strobe switch, and each tested assembling port is electrically connected with a corresponding tested printed wire through a corresponding strobe switch;
    wherein all test printed wires that are arranged parallel to one another and all tested printed wires that are arranged parallel to one another form a grid structure; and
    wherein a distance between the test printed wires corresponding to a same test assembling port and a distance between the tested printed wires corresponding to a same tested assembling port meet respective preset requirements.

2. The signal switching device according to claim 1, wherein the test printed wires extend along a horizontal/vertical direction, and the tested printed wires extend along a vertical/horizontal direction.

3. The signal switching device according to claim 1, wherein the tested apparatus is a liquid crystal display module.

4. The signal switching device according to claim 1, wherein the signal switching device further comprises:
    a third assembling unit, which comprises two third test assembling ports both in connection with a power source test port of the test apparatus; and
    a fourth assembling unit, which comprises two third tested assembling ports both in connection with a power source tested port of the tested apparatus.

5. The signal switching device according to claim 4, wherein the test printed wires extend along a horizontal/vertical direction, and the tested printed wires extend along a vertical/horizontal direction.

6. The signal switching device according to claim 4, wherein the tested apparatus is a liquid crystal display module.

7. The signal switching device according to claim 1, wherein the signal switching device further comprises:
    a fifth assembling unit, which comprises two fourth test assembling ports both in connection with a low-speed signal test port of the test apparatus; and
    a sixth assembling unit, which comprises two fourth tested assembling ports both in connection with a low-speed signal tested port of the tested apparatus.

8. The signal switching device according to claim 7, wherein the test printed wires extend along a horizontal/vertical direction, and the tested printed wires extend along a vertical/horizontal direction.

9. The signal switching device according to claim 7, wherein the tested apparatus is a liquid crystal display module.

10. A test system, comprising a test apparatus and a signal switching device, the signal switching device comprising:
    a plurality of first assembling units, each first assembling unit comprising two first test assembling ports in connection with a first test port and two second test assembling ports in connection with a second test port, the first test port and the second test port constituting a pair of differential signal test ports of the test apparatus;
    a plurality of second assembling units, each second assembling unit comprising two first tested assembling ports in connection with a first tested port and two second tested assembling ports in connection with a second tested port, the first tested port and the second tested port constituting a pair of differential signal tested ports of a tested apparatus;
    strobe switches corresponding to the assembling ports respectively; and a circuit board, which comprises test printed wires corresponding to the test assembling ports respectively, tested printed wires corresponding to the tested assembling ports respectively, and electrical connectors for electrically connecting the test printed wires and the tested printed wires, wherein each test assembling port is electrically connected with a corresponding test printed wire through a corresponding strobe switch, and each tested assembling port is electrically connected with a corresponding tested printed wire through a corresponding strobe switch;

wherein all test printed wires that are arranged parallel to one another and all tested printed wires that are arranged parallel to one another form a grid structure; and wherein a distance between the test printed wires corresponding to a same test assembling port and a distance between the tested printed wires corresponding to a same tested assembling port meet respective preset requirements.

11. The test system according to claim 10, wherein the test printed wires extend along a horizontal/vertical direction, and the tested printed wires extend along a vertical/horizontal direction.

12. The test system according to claim 10, wherein the tested apparatus is a liquid crystal display module.

13. The test system according to claim 10, wherein the signal switching device further comprises:
a third assembling unit, which comprises two third test assembling ports both in connection with a power source test port of the test apparatus; and
a fourth assembling unit, which comprises two third tested assembling ports both in connection with a power source tested port of the tested apparatus.

14. The test system according to claim 13, wherein the test printed wires extend along a horizontal/vertical direction, and the tested printed wires extend along a vertical/horizontal direction.

15. The test system according to claim 13, wherein the tested apparatus is a liquid crystal display module.

16. The test system according to claim 10, wherein the signal switching device further comprises:
a fifth assembling unit, which comprises two fourth test assembling ports both in connection with a low-speed signal test port of the test apparatus; and
a sixth assembling unit, which comprises two fourth tested assembling ports both in connection with a low-speed signal tested port of the tested apparatus.

17. The test system according to claim 16, wherein the test printed wires extend along a horizontal/vertical direction, and the tested printed wires extend along a vertical/horizontal direction.

18. The test system according to claim 16, wherein the tested apparatus is a liquid crystal display module.

* * * * *